United States Patent [19]

Griffin et al.

[11] Patent Number: 4,591,993

[45] Date of Patent: May 27, 1986

[54] METHODOLOGY FOR MAKING LOGIC CIRCUITS

[75] Inventors: William R. Griffin; Lawrence G. Heller, both of South Burlington, Vt.

[73] Assignee: International Business Machines Corporation, Armonk, N.Y.

[21] Appl. No.: 554,148

[22] Filed: Nov. 21, 1983

[51] Int. Cl.$^4$ .......................................... H03K 19/094
[52] U.S. Cl. ................................. 364/491; 307/469; 364/490; 364/716
[58] Field of Search ................. 29/577 C, DIG. 109; 307/448, 451, 468, 469; 357/45; 361/400, 401; 364/490, 491, 716

[56] References Cited

U.S. PATENT DOCUMENTS

| | | | |
|---|---|---|---|
| 3,252,011 | 5/1966 | Zuk | 307/471 |
| 3,643,232 | 2/1972 | Kilby | 307/465 |
| 3,945,000 | 3/1976 | Suzuki et al. | 340/756 |
| 4,069,426 | 1/1978 | Hirasawa | 307/469 |
| 4,482,810 | 11/1984 | Cooke | 364/490 X |

Primary Examiner—Felix D. Gruber
Assistant Examiner—Edward R. Cosimano
Attorney, Agent, or Firm—Stephen J. Limanek

[57] ABSTRACT

A methodology is provided for reducing an arbitrary Boolean logic expression to static CMOS circuits by the use of a general matrix of P channel devices and N channel devices which are interconnected in accordance with the terms of Boolean logic expressions derived from a truth table. More specifically, from a Boolean expression a sum-of-products expression giving the 1 binary data outputs of a truth table having a 0 input is found. This is accomplished by complementing, or barring, the literals which are a binary 1 when the output is 1 and leaving true or unbarred the literals that are a binary 0. Then each input of a given product term is applied to the control gate of a P channel device, which devices are connected in series with one end tied to a source of potential and the other end of the series circuit connected to an output terminal. Each product term is arranged in parallel with other P channel device series circuits to form one half of a complete logic matrix. Similarly, for the other half of the matrix, a sum-of-products expression giving the binary 0 outputs of a truth table having a binary 1 for an input is found. Each input of a given product term is applied to the control gate of an N channel device, which devices are connected in series with one end tied to a potential reference point, such as ground, and the other end of the series circuit is connected to the output terminal. Each product term is arranged in parallel with other N channel device series circuits.

12 Claims, 5 Drawing Figures

4,591,993

METHODOLOGY FOR MAKING LOGIC CIRCUITS

DESCRIPTION

1. Technical Field

This invention relates to the design of logic circuits in integrated circuit semiconductor technology and more particularly to a methodology for making logic circuits in, e.g., complementary metal oxide semiconductor (CMOS) technology.

2. Background Art

It is well known that the CMOS technology provides advantages over integrated semiconductor technologies that use only N channel devices, which may be referred to as NMOS devices, or only P channel devices, which may be referred to as PMOS devices. Some of these advantages include speed and virtually no standby power.

In static logic designs using only the N channel device technology, complex random logic circuits are either constructed from simple logic blocks or from AND/OR arrays which consume direct current power and are often slow and inefficient in the use of semiconductor surface area.

A basic logic circuit comprising a matrix having a plurality of circuits of serially arranged P channel devices disposed between a power supply and an output terminal and having a plurality of circuits of serially arranged N channel devices disposed between the output terminal and a point of reference potential, such as ground, is taught in U.S. Pat. No. 3,252,011, filed by B. Zuk on Mar. 16, 1964.

In U.S. Pat. No. 4,069,426, filed by M. Hirasawa on Oct. 5, 1976, there are taught more complex matrices with more parallel circuits having a higher number of devices for handling a variety of functions. Several logic charts, logic circuits and a truth table are disclosed. Furthermore, this patent discloses logic formulas, one of which relates to the P channel circuit and another which relates to the N channel circuit of a matrix.

U.S. Pat. No. 3,945,000 filed by Y. Suzuki et al on July 30, 1974, discloses a logic matrix having all P channel devices formed in one area of a chip and all N channel devices formed in another area of the chip. Also, this patent discloses that the P channel devices are arranged according to a logic function of a certain expression, and the N channel devices are arranged according to a logic function of a different expression.

U.S. Pat. No. 3,643,232, filed by J. S. Kilby on June 5, 1967, describes a semiconductor chip having a plurality of devices preformed within a semiconductor substrate and then selected devices are interconnected with metallic strips to form desired circuits.

SUMMARY OF THE INVENTION

It is an object of this invention to provide a methodology for making high density circuits which produce any desired Boolean logic function at high speeds with low power and allows automation of logic chip designs from truth tables or logic expressions to the chip layout.

In accordance with the teachings of this invention, a methodology is provided for reducing an arbitrary Boolean logic function or expression to, e.g., static CMOS circuits by the use of a general matrix of P channel devices and N channel devices which are interconnected in accordance with the terms of Boolean logic expressions derived from a truth table. More specifically, a Boolean expression as a sum-of-products expression is derived from the 1 binary data outputs of a truth table having binary 0 and 1 inputs. This is accomplished by complementing, or barring, in the expression the inputs or literals which are a binary 1 when the output is 1 and leaving true or unbarred the inputs or literals that are a binary 0. Then each input of a given product term in the expression is applied as a voltage to the gate electrode of a P channel device, which devices are connected in series with one end tied to a source of potential and the other end of the series circuit connected to an output terminal. Each product term is arranged in parallel with other P channel device series circuits to form one half of a complete logic matrix circuit.

Similarly, for the other half of the matrix, a sum-of-products expression giving the binary 0 outputs of a truth table having binary 1's or 0's for an input is found. Each input of a given product term is applied as a voltage to the control gate of an N channel device, which devices are connected in series with one end tied to a potential reference point, such as ground, and the other end of the series circuit is connected to the output terminal. Each product term is arranged in parallel with other N channel device series circuits to form the other half of the logic matrix. Each of the two halves of the matrix can be minimized by factoring out the common literals in the sum-of-product expressions. Redundant P and N channel devices are eliminated and common nodes are tied together.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
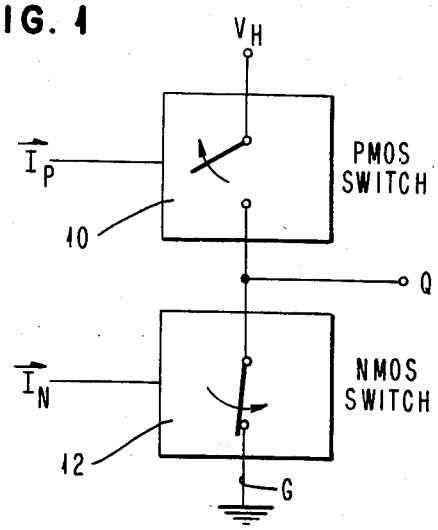
FIG. 1 illustrates a basic schematic diagram within which the circuits produced by the present invention are formed.

Referring to the drawings in more detail, there is illustrated in FIG. 1 a basic schematic diagram within which the circuits produced by the present invention may be formed. The diagram includes a first switch 10, made of one or more PMOS devices, connected between a source of potential $V_H$, which may have a potential of +5 volts, and an output terminal Q with input signals $I_P$ shown in vectorial form to indicate that a plurality of signals or terms may be applied to the input of the PMOS switch 10. The diagram also includes a second switch 12, made of one or more NMOS devices, connected between a point of reference potential, such as ground G, and the output terminal Q with input signals $I_N$ shown in vectorial form to indicate that a plurality of signals or terms may be applied to the input of the NMOS switch 12. The PMOS and NMOS switches 10 and 12, respectively, generally in the form of PMOS and NMOS logic networks, are duals of each other in that when the PMOS switch 10 is open, the NMOS switch 12 is closed, as indicated in FIG. 1, and vice versa. Thus, it can be seen that in the type of circuit or network illustrated in FIG. 1, there is no static direct current (DC) power dissipated at any time.

Figure 2:
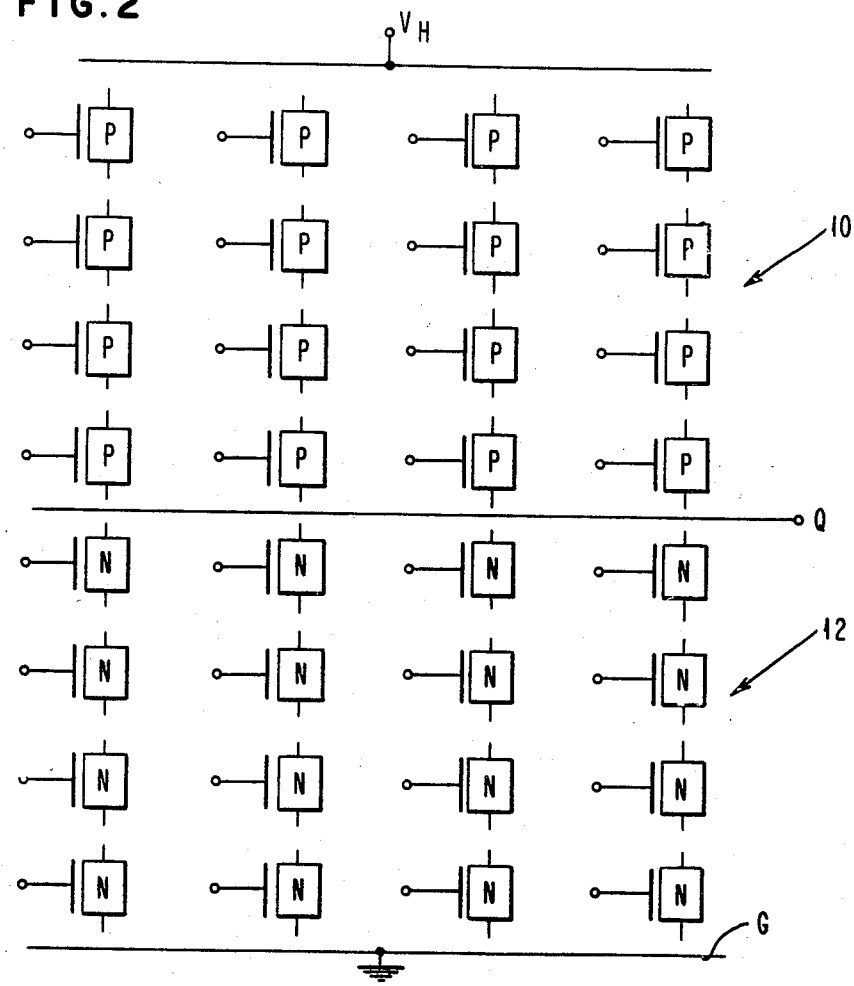
FIG. 2 illustrates a P channel device array and an N channel device array which may be used in the schematic diagram of FIG. 1.

FIG. 2 illustrates a convenient arrangement of P channel devices or field effect transistors, each being identified by P, which may be used to form the PMOS switch or network 10 shown in FIG. 1. A similar arrangement of N channel devices or field effect transistors, each being identified by N, which may be used to form the NMOS switch or network 12 is also shown in FIG. 2.

Figures 3, 4:
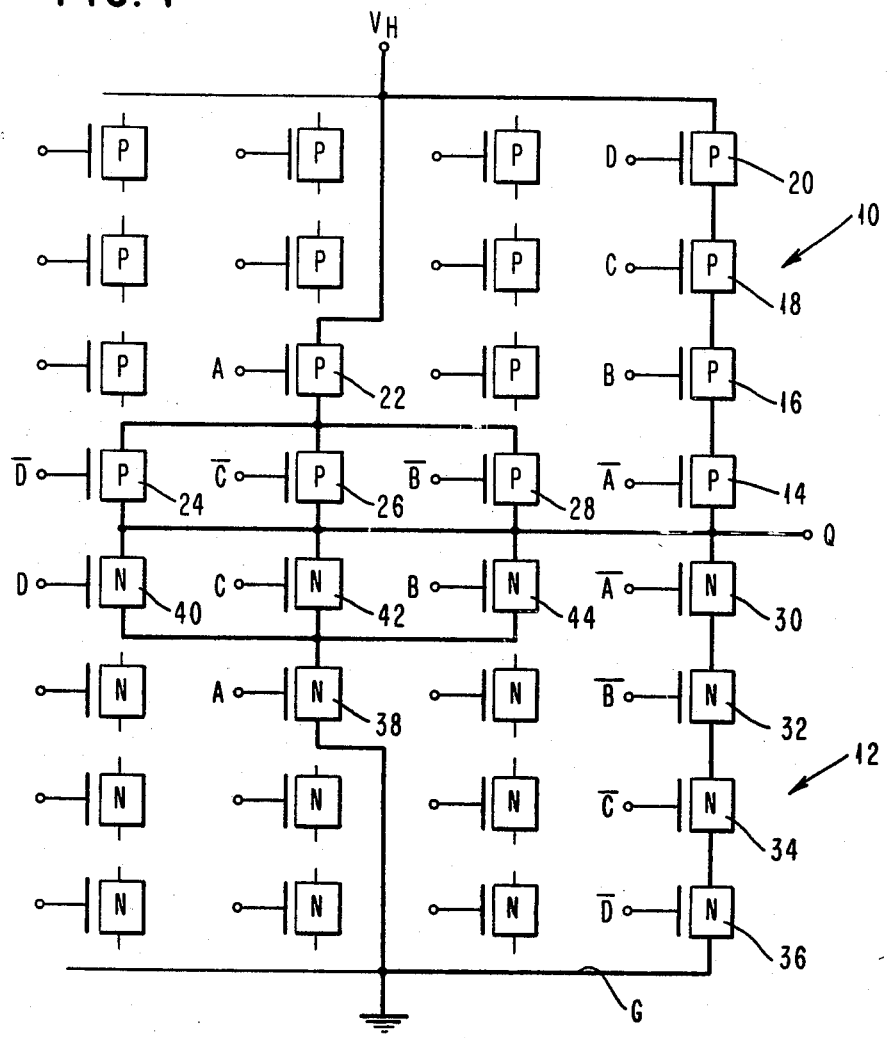
FIG. 3 illustrates an arbitrary logic truth table.
FIG. 4 illustrates a logic circuit formed by appropriately interconnecting the P and N channel devices of FIG. 2 which relates to the truth table of FIG. 3.

FIG. 3 illustrates an arbitrary logic truth table having four input signals or literals A, B, C and D and an indication of the output signal Q, a binary 1 or 0, arranged in four rows and four columns, for the various combinations of inputs of the four literals A, B, C and D. The Boolean expression for this truth table may be found to be $$Q = \bar{A}B\bar{C}\bar{D} + A\bar{B}\bar{C}\bar{D} + \bar{A}\bar{B}\bar{C}D + \bar{A}B\bar{C}D + \bar{A}BC\bar{D} + \bar{A}BC\bar{D} + \bar{A}BCD + ABCD.$$

In accordance with the teachings of this invention, from a truth table, such as the table of FIG. 3, a Boolean logic expression $Q_P$ is derived using 1 binary data outputs having binary 1's and 0's as an input. The inputs or literals which are a binary 1 are complemented, or barred, when the output is a binary 1, with the inputs or literals which are a binary 0 remaining true or unbarred. Thus, by referring to the truth table in FIG. 3, it can be seen that $$Q_P = A\bar{B}CD + \bar{A}BCD + ABC\bar{D} + A\bar{B}C\bar{D} + AB\bar{C}\bar{D} + A\bar{B}\bar{C}D + AB\bar{C}D + A\bar{B}\bar{C}\bar{D}.$$

By using known algebraic theorems and by factoring out the common inputs in the sum-of-product expression, $$Q_P = A\bar{D} + A\bar{C} + A\bar{B} + \overline{ABCD} \text{ or} \quad (1)$$
$$= A(D + C + B) + \overline{ABCD}. \quad (2)$$

Having derived this Boolean expression, a voltage representative of each input of a given product term of the expression is applied to the gate electrode of a P channel device P in the PMOS switch or network 10 which are connected in series with one end tied to the source of potential $V_H$ and the other end of the series circuit connected to the output terminal Q. Each product term is arranged as a series circuit between the potential source $V_H$ and the output terminal Q and in parallel with all other PMOS device series circuits representing other product terms of the expression.

By referring to FIG. 4 of the drawings, it can be seen that the inputs $\bar{A}$, B, C and D of one term of the expression $Q_P$ are connected to the control gates of transistors 14, 16, 18 and 20, respectively, which are serially interconnected between the potential source $V_H$ and the output terminal Q. Furthermore, it can be seen that the input A of the other term of the expression $Q_P$ is connected to the control gate of transistor 22, while the inputs $\bar{D}$, $\bar{C}$ and $\bar{B}$ of this other term are connected to the control gates of transistors 24, 26 and 28, respectively, each of which is connected serially with transistor 22 between the potential source $V_H$ and the output terminal Q, in accordance with the terms of the expression $Q_P$ indicated by formula (2) identified hereinabove. It should be noted that input A could be connected to the gate electrodes of three P channel devices with each of the transistors 24, 26 and 28 being connected serially with a different transistor rather than with the common transistor 22 to form the PMOS switch or network 10, in accordance with the terms of expression $Q_P$ indicated by formula (1) identified hereinabove. However, since fewer transistors are used when forming the PMOS switch or network 10 in accordance with the terms of expression $Q_P$ indicated by formula (2), the circuit arrangement for formula (2) is preferred.

Further in accordance with the teachings of this invention, from the truth table in FIG. 3, a Boolean logic expression $Q_N$ is derived using 0 binary data outputs having binary 1's and 0's as inputs. The inputs or literals which are binary 0 are complemented, or barred, when the output is a binary 0, with the inputs or literals which are a 1 remaining true or unbarred. Thus, by again referring to the truth table in FIG. 3, it can be seen that $$Q_N = \overline{ABCD} + AB\bar{C}\bar{D} + AB\bar{C}D + A\bar{B}\bar{C}D + ABC\bar{D} + A\bar{B}CD + ABC\bar{D} + A\bar{B}C\bar{D}.$$

By using known theorems and by factoring out the common inputs in the sum-of-product expression, $$Q_N = AD + AC + AB + \overline{ABCD} \text{ or} \quad (3)$$
$$= A(D + C + B) + \overline{ABCD}. \quad (4)$$

With this Boolean expression $Q_N$ having been derived from the truth table, a voltage representative of each input of a given product term is applied to the gate electrode of an N channel device N in NMOS switch or network 12 which are connected in series with one end of the series circuit tied to the point of reference potential G and the other end connected to the output terminal Q. Each product term is arranged as a series circuit between the point of reference potential G and the output terminal Q and in parallel with all other NMOS device series circuits representing other product terms of the expression $Q_N$.

By again referring to FIG. 4 of the drawings, it can be seen that the inputs $\bar{A}$, $\bar{B}$, $\bar{C}$ and $\bar{D}$ of one term of the expression $Q_N$ are connected to the control gates of transistors 30, 32, 34, and 36, respectively, which are serially interconnected between the point of reference potential G and the output terminal Q. Furthermore, it can be seen that the input A of the other term of the expression $Q_N$ is connected to the control gate of transistor 38, while the inputs D, C and B of this other term are connected to the control gates of transistors 40, 42 and 44, respectively, each of which is connected serially with transistor 38 between the point of reference potential G and the output terminal Q, in accordance with the terms of the expression $Q_N$ indicated by formula (4) identified hereinabove. It should be noted that input A could be connected to the gate electrode of three N channel devices N with each of the transistors 40, 42 and 44 being connected serially with a different transistor rather than with the common transistor 38 to form the NMOS switch or network 12, in accordance with the terms of expression $Q_N$ indicated by formula (3) identified hereinabove. Generally, since fewer devices are used, the circuit formed in accordance with formula (4) is preferred.

Although the circuit of FIG. 4 was formed from expressions $Q_P$ and $Q_N$, formulas (2) and (4), respectively, derived from the truth table in FIG. 3, it should be understood that other logic circuits may be designed in a similar manner from truth tables which differ from that of FIG. 3. Not only can the truth table of FIG. 3 have the input literals with different outputs, but the number of inputs may be fewer or greater than four, as desired. It can be seen that with four inputs or literals, as in the truth table of FIG. 3, there are four columns and four rows of P channel transistors P and four columns and four rows of N channel transistors N in FIG. 4, although many of these transistors are not used for the logic circuit formed in FIG. 4 and, therefore, are available for other circuits.

Figure 5:
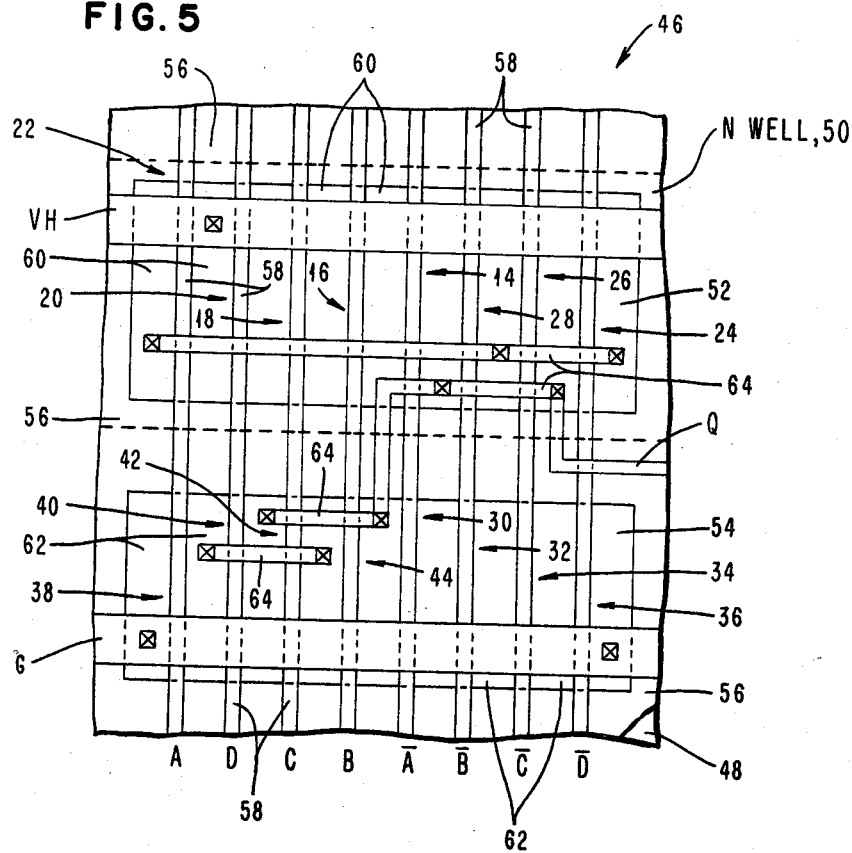
FIG. 5 is a layout or topological view of a semiconductor chip in which the circuit of FIG. 4 is formed.

In FIG. 5, there is illustrated a layout or topological view of a portion of a semiconductor chip or wafer 46 in which the circuit of FIG. 4 is fabricated. The chip 46 includes a substrate 48 which may be made of P conductivity type silicon. An N well 50 is formed in the substrate 48 by, e.g., diffusion or implantation of arsenic. A first thin layer of silicon dioxide 52 is grown or deposited over the N well 50 and a second thin layer of silicon dioxide 54 is grown or deposited over substrate 48 outside of the N well 50 but adjacent thereto. A thick oxide layer 56 is grown or deposited by any known technique over the substrate 48 outside of the thin silicon dioxide layers 52 and 54. A plurality of parallely arranged conductive strips 58, preferably made of doped polysilicon, are formed over the insulating layers 52, 54 and 56. Under the first thin silicon dioxide layer 52 and adjacent to each side of each strip 58 is a source/drain P conductivity type region 60 which may be made by implanting boron into N well 50 with the strips 58 acting as a shield for defining the channel regions of the PMOS devices or transistors, each of which includes two adjacent source/drain regions 60 separated by one of the strips 58 disposed over the transistor's channel region. Under the second thin silicon dioxide layer 54 and adjacent to each side of each strip 58 is a source/drain N conductivity type region 62 which may be made by implanting arsenic into the substrate 48 with the strips 58 acting as a shield for defining the channel regions of the NMOS devices or transistors, each of which includes two adjacent source/drain regions 62 separated by one of the strips 58 disposed over the transistor's channel region. A bus $V_H$ which may be made of metal, such as aluminum, and which is the source of potential for the logic circuit on chip 46 is formed over the P channel transistors 58, 60 and insulated from the polysilicon strips 58. A ground bus G which also may be made of metal is formed over the N channel transistors 58, 62 and insulated from the polysilicon strips 58. Metallic interconnecting strips 64 are also formed over the P and N channel transistors and are insulated from the polysilicon strips 58. Contacts to the source/drain regions 60 and 62 from the metal buses $V_H$ and G and the metallic strips 64 are indicated by an X. The transistors, including the control gates, of the logic circuit of FIG. 4 are indicated in FIG. 5 by the same reference characters.

It can be seen that the structure of FIG. 5 forms a very compact CMOS logic circuit which is readily expandible and which adheres to an automated logic methodology. It is apparent that a finite matrix can be used as a program logic array which is programmable at the mask level. This implementation may be used for any CMOS technology.

It should be understood that this methodology for rapidly preparing logic circuits from truth tables is valid for any random logic function and also for common logic building blocks such as NOR, NAND, AOI, XOR and multiplexers. The stacking of devices is limited only by performance. For several levels, the output may be buffered and amplified, if desired. The speed of operation of this circuit is enhanced by the processing of the input data in parallel and by its compactness. Static DC power is not dissipated at any time.

It should also be understood that the methodology described hereinabove in connection with static CMOS circuits also applies to static and dynamic NMOS circuits and to dynamic CMOS circuits. For static NMOS circuits, the P channel array or PMOS switch 10 is replaced by, e.g., a single N channel load device or transistor. Stacking is limited in this case due to ratioed constraints. Dynamic NMOS and CMOS circuits replace the P channel array 10 with pulsed or clocked load devices of either N or P channel type. Such arrays, however, are leakage and noise sensitive, and must be operated synchronously.

The matrix 10 of FIG. 4 provides amplification, a full supply voltage being available at the output terminal Q. Additional amplification may be provided in the matrix if desired, to further improve speed.

While the invention has been particularly shown and described with reference to preferred embodiments thereof, it will be understood by those skilled in the art that various changes in form and details may be made therein without departing from the spirit and scope of the invention.

What is claimed is:

1. A method of designing a logic circuit which satisfies the requirements of a truth table having a given number of binary input literals and binary output values which comprises forming inputs of first and second product terms of a first Boolean function $Q_P$ from a truth table by complementing the binary input literals which are a 1 when the output value is a binary 1 and using the true binary input literal which is a 0 when the output value is a binary 1, forming inputs of first and second product terms of a second Boolean function $Q_N$ from said truth table by complementing the binary input literals which are a 0 when the output value is a binary 0 and using the true binary input literal which is a 1 when the output value is a binary 0, applying a voltage representative of each input of said first and second product terms of said first Boolean function to control gates of a plurality of P channel transistors interconnected to form first and second series circuits, respectively, connecting said first and second series circuits parallel to each other between a voltage source and an output terminal, applying a voltage representative of each input of said first and second product terms of said second Boolean function to control gates of a plurality of N channel transistors interconnected to form third and fourth series circuits, respectively, and connecting said third and fourth series circuits parallel to each other between said output terminal and a point of reference potential.

2. A method as set forth in claim 1 wherein one of said inputs is common to the first and second terms of said first Boolean function and said first and second series circuits have a common P channel transistor.

3. A method as set forth in claim 1 wherein one of said inputs is common to the first and second terms of said second Boolean function and said third and fourth series circuits have a common N channel transistor.

4. A method of designing a logic circuit for satisfying the requirements of a truth table having a given number of binary input literals and binary output values which comprises forming a first Boolean function $Q_P$ having a plurality of product terms, each of said terms having at least one input, from said truth table by complementing the binary input literals which are a 1 when the output value is a binary 1 and using the true binary input literals which are a 0 when the output value is a binary 1, forming a second Boolean function $Q_N$ having a plurality of product terms, each of said terms having a plurality of inputs, from said truth table by complementing the binary input literals which are a 0 when the output value is a binary 0 and using the true binary input literals which are a 1 when the output value is a binary 0, applying a voltage representative of each input of each product term of said first Boolean function to control gates of a plurality of P channel transistors interconnected to form a plurality of series circuits, connecting said plurality of series circuits in a parallel arrangement between a voltage source and an output terminal, applying a voltage representative of each input of each product term of said second Boolean function to control gates of a plurality of N channel transistors interconnected to form a plurality of series circuits, and connecting said plurality of series circuits of N channel transistors in a parallel arrangement between said output terminal and a point of reference potential.

5. A method of designing a logic circuit for satisfying the requirements of a truth table having a given number of binary input literals and binary output values which comprises forming a first Boolean function $Q_P$ having a plurality of product terms, each of said terms having a plurality of inputs from said truth table by complementing the binary input literals which are a 1 when the output value is a binary 1 and using the true binary input literals which are a 0 when the output value is a binary 1, forming a second Boolean function $Q_N$ having a plurality of product terms, each of said terms having a plurality of inputs, from said truth table by complementing the binary input literals which are a 0 when the output value is a binary 0 and using the true binary input literals which are a 1 when the output value is a binary 0, producing a voltage representative of each input of each of said pluralities of product terms, applying said input voltages of each product term of said first Boolean function to control gates of a plurality of P channel transistors interconnected to form a plurality of series circuits, connecting said plurality of series circuits in a parallel arrangement between a voltage source and an output terminal, applying said input voltages of each product term of said second Boolean function to control gates of a plurality of N channel transistors interconnected to form a plurality of series circuits, and connecting said plurality of series circuits of N channel transistors in a parallel arrangement between said output terminal and a point of reference potential.

6. A method of designing a logic circuit for satisfying the requirements of a truth table having a given number of binary input literals and binary output values which comprises forming a first Boolean function $Q_P$ having a plurality of product terms, each of said terms having a plurality of inputs, from said truth table by complementing the binary input literals which are a 1 when the output value is a binary 1 and using the true binary input literals which are a 0 when the output value is a binary 1, forming a second Boolean function $Q_N$ having a plurality of product terms, each of said terms having a plurality of inputs, from said truth table by complementing the binary input literals which are a 0 when the output value is a binary 0 and using the true binary input literals which are a 1 when the output value is a binary 0, forming a first matrix of a plurality of P channel field effect transistors, forming a second matrix of a plurality of N channel field effect transistors, producing a voltage representative of each input of each of said pluralities of product terms, applying said input voltages of each product term of said first Boolean function to control gates of a plurality of said P channel transistors interconnected to form a plurality of series circuits, connecting said plurality of series circuits in a parallel arrangement between a voltage source and an output terminal, applying said input voltages of each product term of said second Boolean function to control gates of a plurality of said N channel transistors interconnected to form a plurality of series circuits, and connecting said plurality of series circuits of N channel transistors in a parallel arrangement between said output terminal and a point of reference potential.

7. A method as set forth in claim 6 wherein one of said inputs is common to two of said product terms of said first Boolean function and at least two of said series circuits of P channel transistors have a common P channel transistor.

8. A method as set forth in claim 6 wherein one of said inputs is common to two of said product terms of said second Boolean function and at least two of said series circuits of N channel transistors have a common N channel transistor.

9. A method as set forth in claim 6 which further comprises forming said second matrix of N channel transistors in a first region of a P type conductivity semiconductor substrate, forming an N well in a second region of said substrate adjacent to said first region, and forming said first matrix of P channel regions in said N well.

10. A method of designing a logic circuit which satisfies the requirements of a truth table having a given number of binary input literals and binary output values which comprises forming inputs of a plurality of product terms of a first Boolean function $Q_P$ from a truth table by complementing the binary input literals which are a 1 when the output value is a binary 1 and using the true binary input literal which is a 0 when the output value is a binary 1, reducing said first Boolean function $Q_P$ to a form having a minimum number of inputs, forming inputs of a plurality of product terms of a second Boolean function $Q_N$ from said truth table by complementing the binary input literals which are a 0 when the output value is a binary 0 and using the true binary input literals which are a 1 when the output value is a binary 0, reducing said second Boolean function $Q_N$ to a form having a minimum number of inputs, applying a voltage representative of each of said minimum number of inputs of said first Boolean function $Q_p$ to control gates of a plurality of P channel transistors interconnected to form a plurality of series circuits, connecting said plurality of series circuits in a parallel arrangement between a voltage source and an output terminal, applying a voltage representative of each of said minimum number of inputs of said second Boolean function $Q_N$ to control gates of a plurality of N channel transistors interconnected to form a plurality of series circuits, and connecting said plurality of series circuits of N channel transistors in parallel arrangement between said output terminal and a point of reference potential.

11. A method as set forth in claim 9 which further comprises aligning said N channel transistors in rows and columns within said first region and aligning said P channel transistors in rows and columns within said N well.

12. A method of designing a logic circuit which satisfies the requirements of a truth table having a given number of binary input literals and binary output values which comprises forming a first function having a plurality of product terms from a truth table, each of said terms having a number of inputs equal to said given number and being formed by complementing the binary input literals which are a 1 when the output value is a binary 1 and using the true binary input literal which is a 0 when the output value is a binary 1, reducing said first function to a form having a minimum number of product terms, forming a plurality of series circuits of P channel transistors in parallel between a voltage source and an output terminal, applying a voltage representative of each input of each product term of said reduced first function to the control gates of the P channel transistors of a respective one of said series circuits, forming a second function having a plurality of product terms from said truth table, each of said terms having a number of inputs equal to said given number and being formed by complementing the binary input literals which are a 0 when the output value is a binary 0 and using the true binary input literal which is a 1 when the output value is a 0, reducing said second function to a form having a minimum number of product terms, forming a plurality of series circuits of N channel transistors in parallel between a point of reference potential and said output terminal, and applying a voltage representative of each input of each product term of said reduced second function to the control gates of the N channel transistors of a respective one of said series circuits of N channel transistors.

* * * * *